United States Patent
Lim et al.

(10) Patent No.: US 9,772,231 B2
(45) Date of Patent: Sep. 26, 2017

(54) REMOTE TEMPERATURE SENSING

(71) Applicant: Infineon Technologies AG, Neubiberg (DE)

(72) Inventors: Cheow Guan Lim, Singapore (SG); Yoon Hwee Leow, Singapore (SG); Tue Fatt David Wee, Singapore (SG)

(73) Assignee: Infineon Technologies AG, Neubiberg (DE)

(*) Notice: Subject to any disclaimer, the term of this patent is extended or adjusted under 35 U.S.C. 154(b) by 681 days.

(21) Appl. No.: 14/286,482

(22) Filed: May 23, 2014

(65) Prior Publication Data

US 2015/0338282 A1 Nov. 26, 2015

(51) Int. Cl.
*G01K 7/00* (2006.01)
*G01K 7/01* (2006.01)
*H03M 3/00* (2006.01)

(52) U.S. Cl.
CPC .............. *G01K 7/01* (2013.01); *H03M 3/458* (2013.01)

(58) Field of Classification Search
USPC ........................ 374/178, 170, 152; 327/512
See application file for complete search history.

(56) References Cited

U.S. PATENT DOCUMENTS

| | | | | |
|---|---|---|---|---|
| 6,554,469 B1* | 4/2003 | Thomson | ................ | G01K 7/01 327/512 |
| 7,010,440 B1* | 3/2006 | Lillis | ........................ | G01K 7/01 327/512 |
| 7,150,561 B1* | 12/2006 | D'Aquino | .............. | G01K 7/015 327/512 |
| 7,309,157 B1* | 12/2007 | Aslan | ..................... | G01K 15/00 327/513 |
| 7,333,038 B1* | 2/2008 | Aslan | ..................... | G01K 7/015 341/118 |

(Continued)

FOREIGN PATENT DOCUMENTS

| | | |
|---|---|---|
| CN | 103217229 A | 7/2013 |
| CN | 103234656 A | 8/2013 |

OTHER PUBLICATIONS

Pertijs, M. "A CMOS Smart Temperature Sensor With a 3 Inaccuracy of 0.1 C From 55 C to 125 C". IEEE Journal of Solid-State Circuits, vol. 40, No. 12, Dec. 2005. 11 pp.

(Continued)

*Primary Examiner* — Mirellys Jagan
(74) *Attorney, Agent, or Firm* — Shumaker & Sieffert, P.A.

(57) ABSTRACT

In one example, a method includes determining, by a device, a plurality of voltage values that each correspond to a respective voltage drop across a remote p-n junction while the remote p-n junction is biased at different respective current levels, wherein each of the plurality of voltage values is a function of at least: one of the different respective current levels, a temperature of the remote p-n junction, and a series resistance between the device and the remote p-n junction. In this example, the method also includes, determining, by the device, an intermediate value based on a difference between at least three voltage values of the plurality of voltage values, wherein the intermediate value is not a function of the series resistance, and determining the temperature of the remote p-n junction based on the intermediate value such that the temperature is not a function of the series resistance.

18 Claims, 6 Drawing Sheets

(56) References Cited

U.S. PATENT DOCUMENTS

| | | |
|---|---|---|
| 7,524,109 B2 | 4/2009 | Gardner et al. |
| 2006/0039445 A1* | 2/2006 | McLeod .................. G01K 7/01 374/178 |
| 2006/0193370 A1* | 8/2006 | St. Pierre ................ G01K 7/01 374/178 |
| 2007/0091979 A1* | 4/2007 | Chiu ....................... G01K 7/01 374/1 |
| 2010/0040111 A1 | 2/2010 | Cheng et al. |
| 2012/0207190 A1 | 8/2012 | Trampitsch |
| 2015/0003490 A1* | 1/2015 | Ash ..................... G01K 15/005 374/1 |

OTHER PUBLICATIONS

Smith, M. "Measuring temperatures on computer chips with speed and accuracy: A new approach using silicon sensors and off-chip processing" Analog Dialogue 33-4. 1999 Analog Devices. 5 pp.

"Remote and Local System Temperature Monitor". Product Description ADM1032. Article by ON Semiconductor. Oct. 2013. 18 pp.

\* cited by examiner

REMOTE TEMPERATURE SENSING

TECHNICAL FIELD

The invention relates to remote temperature sensing, and in particular, to remote temperature sensing using a p-n junction.

BACKGROUND

The ability to accurately measure temperature may be beneficial for the operation of a device and/or system. In some examples, a p-n junction may be used to measure temperature. Due to their physical properties, the voltage drop across a p-n junction may be related to the temperature of the p-n junction through equation (1), below, where $V_T$ is the voltage drop across the p-n junction, K is the Boltzmann's constant (e.g., ~1.380*10$^{-23}$ Joules per degree Kelvin), T is the absolute temperature of the p-n junction in degrees Kelvin, and q is the elementary charge (e.g., ~1.602*10$^{-19}$ Coulombs).

$$V_T = \frac{K \cdot T}{q} \quad (1)$$

SUMMARY

In some examples, it may not be desirable to position the p-n junction near the device and/or system that uses the voltage drop across the p-n junction to determine the temperature of the p-n junction. In other words, it may be desirable to determine the temperature of a remotely positioned p-n junction based on the voltage drop across the p-n junction. In some examples, one or more connective elements may be used to connect a remotely located p-n junction to the device that determines the temperature of the p-n junction.

In general, this disclosure is directed to techniques for reducing the error introduced by connective elements (e.g., a series resistance) between a remote p-n junction and a device that determines a temperature of the remote p-n junction. As one example, the device may perform one or more operations to cancel out the error such that the determined temperature is not a function of the error introduced by the connective elements. As another example, the device may perform one or more operations to determine the error introduced by connective elements error such that the error is a known quantity used to determine the temperature.

In one example, a method includes determining, by a device, a plurality of voltage values that each correspond to a respective voltage drop across a remote p-n junction while the remote p-n junction is biased at different respective current levels, wherein each of the plurality of voltage values is a function of at least: one of the different respective current level s, a temperature of the remote p-n junction, and a series resistance between the device and the remote p-n junction. In this example, the method also includes, determining, by the device, an intermediate value based on a difference between at least three voltage values of the plurality of voltage values, wherein the intermediate value is not a function of the series resistance. In this example, the method also includes determining, by the device, the temperature of the remote p-n junction based on the intermediate value such that the temperature is not a function of the series resistance.

In another example, a device includes an analog-to-digital converter configured to determine a plurality of voltage values that each correspond to a respective voltage drop across a remote p-n junction while the remote p-n junction is biased at different respective current level s, wherein each of the plurality of voltage values is a function of at least: one of the different respective current level s, a temperature of the remote p-n junction, and a series resistance between the device and the remote p-n junction. In this example, the device also includes one or more processors configured to determine an intermediate value based on a difference between at least three voltage values of the plurality of voltage values, wherein the intermediate value is not a function of the series resistance, wherein the one or more processors are further configured to determine, by the device, the temperature of the remote p-n junction based on the intermediate value such that the temperature is not a function of the series resistance.

In another example, a device includes means for determining a plurality of voltage values that each correspond to a respective voltage drop across a remote p-n junction while the remote p-n junction is biased at different respective current level s, wherein each of the plurality of voltage values is a function of at least: one of the respective current level s, a temperature of the remote p-n junction, and a series resistance between the device and the remote p-n junction. In this example, the device also includes means for determining an intermediate value based on a difference between at least three voltage values of the plurality of voltage values, wherein the intermediate value is not a function of the series resistance. In this example, the device also includes means for determining the temperature of the remote p-n junction based on the intermediate value such that the temperature is not a function of the series resistance.

In another example, a method includes determining, by a device, a plurality of values that each correspond to a respective duty ratio of an analog-to-digital converter (ADC) that is measuring a respective voltage drop across a remote p-n junction while the remote p-n junction is biased at different respective current level s, wherein each of the plurality of values is a function of at least: one of the different respective current levels, a temperature of the remote p-n junction, and a series resistance between the analog-to-digital converter and the remote p-n junction. In this example, the method also includes determining, by the device, the series resistance between the ADC and the remote p-n junction based on a difference between at least two values of the plurality of values. In this example, the method also includes determining, by the device, the temperature of the remote p-n junction as a function of the determined series resistance.

In another example, a device includes an analog-to-digital converter (ADC) configured to determine a plurality of values that each correspond to a respective duty ratio of the ADC while the ADC is measuring a respective voltage drop across a remote p-n junction while the remote p-n junction is biased at different respective current level s, wherein each of the plurality of values is a function of at least: one of the different respective current level s, a temperature of the remote p-n junction, and a series resistance between the analog-to-digital converter and the remote p-n junction. In this example, the device also includes one or more processors configured to determine the unknown resistance between the ADC and the remote p-n junction based on a difference between at least two values of the plurality of values, wherein the one or more processors are further configured to determine the temperature of the remote p-n junction as a function of the determined series resistance.

Details of these and other examples are set forth in the accompanying drawings and the description below. Other features, objects, and advantages of the invention will be apparent from the description and drawings, and from the claims.

DETAILED DESCRIPTION

Figure 1:
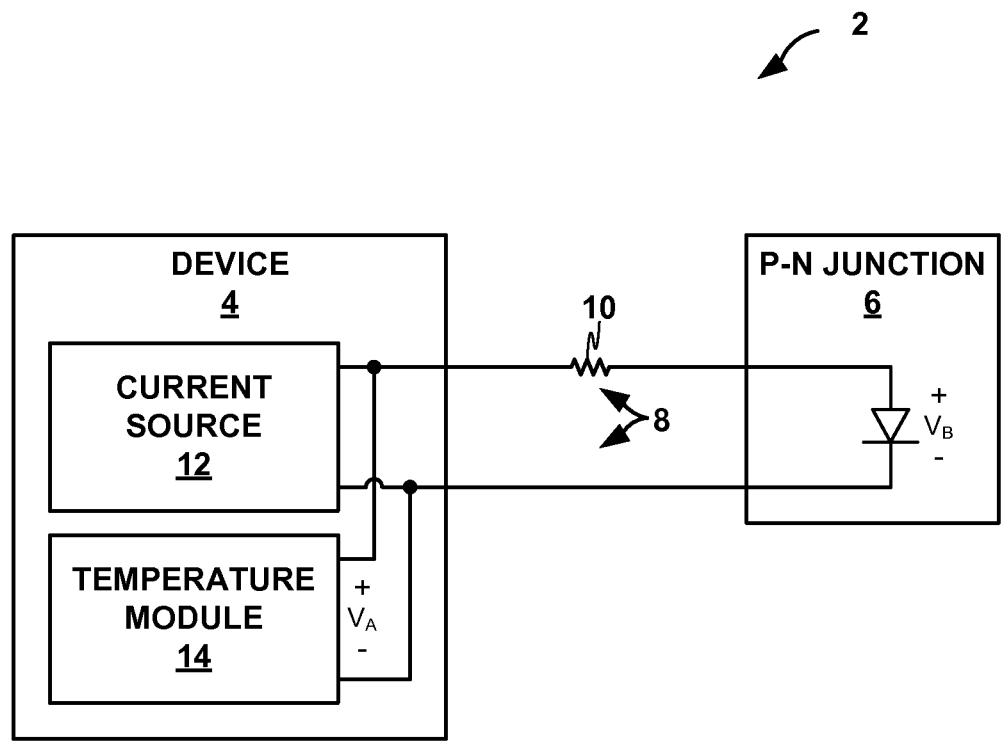
FIG. 1 is a conceptual diagram illustrating an example system that includes a device for determining the temperature of a remote p-n junction, in accordance with one or more techniques of this disclosure.

In general, this disclosure is directed to techniques for reducing the error introduced by connective elements (e.g., a series resistance) between a remote p-n junction and a device that determines a temperature of the remote p-n junction. As one example, the device may perform one or more operations to cancel out the error such that the determined temperature is not a function of the error introduced by the connective elements. As another example, the device may perform one or more operations to determine the error introduced by connective elements error such that the error is a known quantity used to determine the temperature.

In accordance with one or more techniques of this disclosure, a device may determine the temperature of the remote p-n junction based on a difference between a plurality of voltage values that each correspond to a respective voltage drop across a remote p-n junction while the remote p-n junction is biased at a different respective current level for measuring each respective voltage drop. In this way, the device may cancel out the error introduced by the series resistance in order to reduce the effects of the error on the temperature determination.

In some examples, analog means may be used to eliminate the series resistance. For instance, two pairs of sourcing currents may be selected such that the difference between the first pair of sourcing currents and the second pair of sourcing currents is the same. With the first pair of current sources, a first voltage difference that corresponds to the difference between a first voltage drop across a remote p-n junction biased with a first current of the first pair of sourcing currents and a second voltage drop across the remote p-n junction biased with a second current of the first pair of sourcing currents may be generated. Similarly, a second voltage difference may be generated with the second current pair. By subtracting the first and second voltage differences, the voltage drop across the series resistance may be automatically eliminated.

In some examples, digital means may be used to eliminate the series resistance. For instance, a first voltage difference may generated with a first current pair with a desired current ratio. A first digitization may be performed and the result may be stored. A second voltage difference may be generated with a second current pair having different absolute values but the exact same current ratio as the first current pair. A second digitization may then be performed and the result may be stored. The difference between the two digitally stored results may yield the information on the voltage drop across the series resistance and may be compensated for via digital means.

In accordance with one or more techniques of this disclosure, a device may determine a value of the series resistance introduced by the connective elements based on a plurality of values that each correspond to a respective duty ratio of an analog-to-digital converter that is measuring respective voltage drops across a remote p-n junction while the remote p-n junction is biased at different respective current levels, and use the determined value of the series resistance when determining the temperature of the remote p-n junction. In this way, the device may reduce the effects of the error on the temperature determination.

FIG. 1 is a conceptual diagram illustrating an example system 2 that includes a device for determining the temperature of a remote p-n junction, in accordance with one or more techniques of this disclosure. As illustrated in the example of FIG. 1, system 2 may include device 4, p-n junction 6, and connective elements 8. Examples of device 4 may include but are not limited to one or more processors, including, one or more microprocessors, digital signal processors (DSPs), application specific integrated circuits (ASICs), field programmable gate arrays (FPGAs), or any other equivalent integrated or discrete logic circuitry, as well as any combinations of such components. As illustrated in FIG. 1, device 4 may include current source 12, and temperature module 14.

In some examples, device 4 may include current source 12 which may be configured to output current at a plurality of levels. For instance, current source 12 may output current onto connective elements 8 to bias p-n junction 6. In some examples, current source 12 may be configured to output at least three different current levels. In some examples, current source 12 may be configured to output current at a particular current level in response to receiving a signal from another component of system 2, such as temperature module 14. In examples, current source 12 may be integrated into device 4. In some examples, current source 12 may be external from device 4.

In some examples, device 4 may include temperature module 14 which may be configured to determine a temperature of a p-n junction, such as p-n junction 6. In some examples, temperature module 14 may be configured to determine the temperature of p-n junction 6 by measuring a voltage drop across p-n junction 6. In some examples, temperature module 14 may be configured to reduce the effects of an error introduced by connective elements 8. As one example, temperature module 6 may be configured to cancel out the effects of series resistance 10 introduced by connective elements 8 when determining the temperature of p-n junction 6. As another example, temperature module 6 may be configured to determine a value of series resistance 10 and use the determined value when determining the temperature of p-n junction 6. In some examples, temperature module 14 and/or connective elements 8 may include a low pass filter configured to eliminate coupled noise. For instance, one or both of temperature module 14 and connective elements 8 may include a RC low pass filter (e.g., a capacitor in parallel to p-n junction 6 and a resistor between the capacitor and temperature module 14).

In some examples, system 2 may include p-n junction 6 which may be configured to measure a temperature. For instance, due to one or more physical properties of p-n junction 6, the voltage drop across p-n junction 6 may be related to the temperature of p-n junction 6 through equation (1), above. In some examples, such as where p-n junction 6 is not included in device 4, p-n junction 6 may be considered to be a remote p-n junction. Examples of p-n junction 6 include, but are not limited to, diodes, transistors, and the like.

In some examples, system 2 may include connective elements 8 which may be configured to electrically couple device 4 to p-n junction 6. Examples of connective elements 8 include, but are not limited to, wires, solder connections, printed circuit board (PCB) traces, plugs, receptacles, and the like. In some examples, connective elements 8 may exhibit one or more non-ideal characteristics. For instance, connective elements 8 may exhibit parasitic resistance which may be included in series resistance 10. As illustrated in FIG. 1, connective elements 8 may include two distinct electrical paths (e.g., an outbound path and an inbound path).

In some examples, the resistance value of series resistance 10 may be non-predetermined. For instance, the resistance value of series resistance 10 may not be available to device 4, e.g., while temperature module 14 determines the temperature of the p-n junction. In other words, in some examples, the resistance value of series resistance 10 may be unknown. In some examples, the resistance value of series resistance 10 may include one or more known resistances in addition to the non-predetermined resistances. For instance, the resistance value of series resistance 10 may include a resistance from the resistor of the RC low pass filter discussed above.

In accordance with one or more techniques of this disclosure, device 4 may reduce the error introduced by connective elements 8 when determining the temperature of p-n junction 6. As discussed above, temperature module 14 of device 4 may reduce the error introduced by connective elements 8 when determining the temperature of p-n junction 6 by canceling out the effects of the error introduced by connective elements 8. In some examples, temperature module 14 may cancel out the error introduced by connective elements 8 when determining the temperature of p-n junction 6 by determining a difference between a plurality of voltage values that each correspond to a respective voltage drop across p-n junction 6 while current source 12 biases p-n junction 6 at a different respective current level.

For instance, at a first time $T_1$, temperature module 14 may send a signal to current source 12 that causes current source 12 to bias p-n junction 6 with a first current ($I_1$). While p-n junction 6 is biased with the first current, temperature module 14 may determine a first voltage value ($V_1$) as the voltage drop across connective elements 8 (i.e., $V_A$) that corresponds to the voltage drop across p-n junction 6 (i.e., $V_B$). In some examples, temperature module 14 may store the first voltage value for later use. In some examples, the first voltage value may be representative of equation (2a), below, where $V_1$ is the first voltage value, η is the ideality factor of p-n junction 6, K is the Boltzmann's constant, T is the temperature of p-n junction 6, q is the elementary charge constant, $I_s$ is the saturation current of p-n junction 6, $I_1$ is the first current output by current source 12, and $R_p$ is the value of series resistance 10.

$$V_1 = \eta \cdot \frac{K \cdot T}{q} \cdot \ln\left(\frac{I_1}{I_s} + 1\right) + I_1 \cdot R_p \quad (2a)$$

In some examples, a ratio of the first current output by current source 12 and the saturation current of p-n junction 6 may be selected to be greater than one. In such examples, the first voltage value may be representative of equation (3a), below.

$$V_1 = \eta \cdot \frac{K \cdot T}{q} \cdot \ln\left(\frac{I_1}{I_s}\right) + I_1 \cdot R_p; \text{ where } \frac{I_1}{I_s} \gg 1 \quad (3a)$$

At a second time $T_2$, temperature module 14 may send a signal to current source 12 that causes current source 12 to bias p-n junction 6 with a second current ($I_2$). While p-n junction 6 is biased with the second current, temperature module 14 may determine a second voltage value ($V_2$) as the voltage drop across connective elements 8 (i.e., $V_A$) that corresponds to the voltage drop across p-n junction 6 (i.e., $V_B$). In some examples, temperature module 14 may store the second voltage value for later use. In some examples, the second voltage value may be representative of equation (2b), below, where $V_2$ is the second voltage value, η is the ideality factor of p-n junction 6, K is the Boltzmann's constant, T is the temperature of p-n junction 6, q is the elementary charge constant, $I_s$ is the saturation current of p-n junction 6, $I_2$ is the second current output by current source 12, and $R_p$ is the value of series resistance 10.

$$V_2 = \eta \cdot \frac{K \cdot T}{q} \cdot \ln\left(\frac{I_2}{I_s} + 1\right) + I_2 \cdot R_p \quad (2b)$$

In some examples, a ratio of the second current output by current source 12 and the saturation current of p-n junction 6 may be selected to be greater than one. In such examples, the second voltage value may be representative of equation (3b), below.

$$V_2 = \eta \cdot \frac{K \cdot T}{q} \cdot \ln\left(\frac{I_1}{I_s}\right) + I_2 \cdot R_p; \text{ where } \frac{I_2}{I_s} \gg 1 \quad (3b)$$

At a third time $T_3$, temperature module 14 may send a signal to current source 12 that causes current source 12 to bias p-n junction 6 with a third current ($I_3$). While p-n junction 6 is biased with the third current, temperature module 14 may determine a third voltage value ($V_3$) as the voltage drop across connective elements 8 (i.e., $V_A$) that corresponds to the voltage drop across p-n junction 6 (i.e., $V_B$). In some examples, temperature module 14 may store the third voltage value for later use. In some examples, the third voltage value may be representative of equation (2c), below, where $V_3$ is the third voltage value, ɳ is the ideality factor of p-n junction 6, K is the Boltzmann's constant, T is the temperature of p-n junction 6, q is the elementary charge constant, $I_s$ is the saturation current of p-n junction 6, $I_3$ is the third current output by current source 12, and $R_p$ is the value of series resistance 10.

$$V_3 = ɳ \cdot \frac{K \cdot T}{q} \cdot \ln\left(\frac{I_3}{I_s} + 1\right) + I_3 \cdot R_p \tag{2c}$$

In some examples, a ratio of the third current output by current source 12 and the saturation current of p-n junction 6 may be selected to be greater than one. In such examples, the third voltage value may be representative of equation (3b), below.

$$V_3 = ɳ \cdot \frac{K \cdot T}{q} \cdot \ln\left(\frac{I_3}{I_s}\right) + I_3 \cdot R_p; \text{ where } \frac{I_3}{I_s} \gg 1 \tag{3c}$$

At a fourth time $T_4$, temperature module 14 may send a signal to current source 12 that causes current source 12 to bias p-n junction 6 with a fourth current ($I_4$). While p-n junction 6 is biased with the fourth current, temperature module 14 may determine a fourth voltage value ($V_4$) as the voltage drop across connective elements 8 (i.e., $V_A$) that corresponds to the voltage drop across p-n junction 6 (i.e., $V_B$). In some examples, temperature module 14 may store the fourth voltage value for later use. In some examples, the fourth voltage value may be representative of equation (2d), below, where $V_4$ is the fourth voltage value, ɳ is the ideality factor of p-n junction 6, K is the Boltzmann's constant, T is the temperature of p-n junction 6, q is the elementary charge constant, $I_s$ is the saturation current of p-n junction 6, $I_4$ is the fourth current output by current source 12, and $R_p$ is the value of series resistance 10.

$$V_4 = ɳ \cdot \frac{K \cdot T}{q} \cdot \ln\left(\frac{I_4}{I_s} + 1\right) + I_4 \cdot R_p \tag{2d}$$

In some examples, a ratio of the fourth current output by current source 12 and the saturation current of p-n junction 6 may be selected to be greater than one. In such examples, the fourth voltage value may be representative of equation (3b), below.

$$V_4 = ɳ \cdot \frac{K \cdot T}{q} \cdot \ln\left(\frac{I_4}{I_s}\right) + I_4 \cdot R_p; \text{ where } \frac{I_4}{I_s} \gg 1 \tag{3d}$$

In some examples, temperature module 14 may cause current source 12 to output the currents such that the currents satisfy a relationship. For instance, temperature module 14 may cause current source 12 to output the currents such that the currents satisfy the relationship illustrated by equation (4), below.

$$I_1 - I_2 = I_3 - I_4 \tag{4}$$

In some examples, temperature module 14 may determine an intermediate value based on a difference between at least three voltage values that each corresponds to a respective voltage drop across p-n junction 6 while p-n junction 6 is biased with a different respective current level. In some examples, temperature module 14 may determine the intermediate value by determining a difference between at least two delta voltage values that each correspond to a difference between a pair of the determined voltage values. In some examples, temperature module 14 may determine a first delta voltage value as the difference between the first voltage value determined by temperature module 14 while p-n junction 6 was biased with the first current (i.e., $V_1$) and the second voltage value determined by temperature module 14 while p-n junction 6 was biased with the second current (i.e., $V_2$). In some examples, the first delta voltage value may be representative of equation (5a), below.

$$\Delta V_{be1} = V_1 - V_2 = ɳ \cdot \frac{K \cdot T}{q} \cdot \ln\left(\frac{I_{D1}}{I_{D2}}\right) + (I_{D1} - I_{D2}) \cdot R_p \tag{5a}$$

In some examples, temperature module 14 may determine a second delta voltage value as the difference between the third voltage value determined by temperature module 14 while p-n junction 6 was biased with the third current (i.e., $V_3$) and the fourth voltage value determined by temperature module 14 while p-n junction 6 was biased with the fourth current (i.e., $V_4$). In some examples, the first delta voltage value may be representative of equation (5b), below.

$$\Delta V_{be2} = V_3 - V_4 = ɳ \cdot \frac{K \cdot T}{q} \cdot \ln\left(\frac{I_{D3}}{I_{D4}}\right) + (I_{D3} - I_{D4}) \cdot R_p \tag{5b}$$

In order to cancel out the effects of series resistance 10, temperature module 14 may determine the intermediate value as a difference between the first delta voltage value and the second delta voltage value. In some examples, the intermediate value may be representative of equations (6a)-(6c), below.

$$\Delta V_{BE} = \Delta V_{be1} - \Delta V_{be2} \tag{6a}$$

$$\Delta V_{BE} = ɳ \cdot \frac{K \cdot T}{q} \cdot \ln\left(\frac{I_{D1} \cdot I_{D4}}{I_{D2} \cdot I_{D3}}\right) + (I_{D1} - I_{D2}) \cdot R_p - (I_{D3} - I_{D4}) \cdot R_p \tag{6b}$$

$$\Delta V_{BE} = \cdot \frac{K \cdot T}{q} \cdot \ln\left(\frac{I_{D1} \cdot I_{D4}}{I_{D2} \cdot I_{D3}}\right) \tag{6c}$$

As shown above in equations (6a)-(6c), by determining the difference between the two delta voltage values, the resulting intermediate value is no longer a function of series resistance 10. When solved for the temperature of p-n junction 6 (i.e., T), equation (6c) may be transformed into equation (7), below. Using equation (7), temperature module 14 may determine the temperature of p-n junction 6 based on the intermediate value.

$$T = \frac{\Delta V_{BE}}{ɳ \cdot \frac{K}{q} \cdot \ln\left(\frac{I_{D1} \cdot I_{D4}}{I_{D2} \cdot I_{D3}}\right)} \tag{7}$$

In this way, temperature module 14 may determine the temperature of p-n junction 6 such that the determined temperature is not a function of series resistance 10. As such, temperature module 14 may reduce the error introduced by connective elements 8 into the determined temperature.

In some examples, as opposed to determining the temperature of p-n junction 6 based on four voltage values that each corresponds to a respective voltage drop across p-n junction 6 while p-n junction 6 is biased with a different respective current level, temperature module 14 may determine the temperature of p-n junction 6 based on only three voltage values that each corresponds to a respective voltage drop across p-n junction 6 while p-n junction 6 is biased with a different respective current level. In some examples, temperature module 14 may determine the temperature based on three voltage values by reusing the first voltage value and the first current level. In other words, temperature module 14 may determine the second delta voltage value in accordance with equation (8), below.

$$\Delta V_{be2} = V_3 - V_1 = \eta \cdot \frac{K \cdot T}{q} \cdot \ln\left(\frac{I_{D3}}{I_{D1}}\right) + (I_{D3} - I_{D1}) \cdot R_p \quad (8)$$

In such examples, temperature module 14 may still satisfy the current relationship of equation (4) by selecting the second current value and the second current value in accordance with equation (9).

$$I_2 = 2 \cdot I_1 - I_3 \quad (9)$$

By re-using one of the voltage values and its corresponding current level, temperature module 14 may reduce the complexity of the calculations needed to determine the temperature of p-n junction 6.

In some examples, temperature module 14 may include an analog-to-digital converter (ADC) that may be configured to determine the voltage values. In some of such examples, the first voltage value determined by temperature module 14 while p-n junction 6 is biased at a first current $I_1$ may be representative of equation (10), below, where $V_1$ is the first voltage value, η is the ideality factor of the p-n junction 6, K is the Boltzmann's constant, T is the temperature of p-n junction 6, q is the elementary charge constant, $I_s$ is the saturation current of p-n junction 6, $I_1$ is the first current output by current source 12, $R_p$ is the value of series resistance 10, and $V_{os}$ is the input offset voltage of the ADC.

$$V_1 = \eta \cdot \frac{K \cdot T}{q} \cdot \ln\left(\frac{I_1}{I_s}\right) + I_1 \cdot R_p + V_{os} \quad (10)$$

In some examples, the second voltage value determined by temperature module 14 while p-n junction 6 is biased at a second current $I_2$ may be representative of equation (11), below, where $V_2$ is the second voltage value, η is the ideality factor of the p-n junction 6, K is the Boltzmann's constant, T is the temperature of p-n junction 6, q is the elementary charge constant, $I_s$ is the saturation current of the p-n junction 6, $I_2$ is the second current output by current source 12, $R_p$ is the value of series resistance 10, and $V_{os}$ is the input offset voltage of the ADC.

$$V_2 = \eta \cdot \frac{K \cdot T}{q} \cdot \ln\left(\frac{I_2}{I_s}\right) + I_2 \cdot R_p + V_{os} \quad (11)$$

In some examples, temperature module 14 may cause current source 12 to output the second current such that the second current satisfies equation (12), below, where N is an arbitrary multiplier.

$$I_1 = N \cdot I_2 \quad (12)$$

In some examples, the third voltage value determined by temperature module 14 while p-n junction 6 is biased at a third current $I_3$ may be representative of equation (13), below, where $V_3$ is the third voltage value, η is the ideality factor of the p-n junction 6, K is the Boltzmann's constant, T is the temperature of p-n junction 6, q is the elementary charge constant, $I_s$ is the saturation current of the p-n junction 6, $I_2$ is the second current output by current source 12, $R_p$ is the value of series resistance 10, and $V_{os}$ is the input offset voltage of the ADC.

$$V_3 = \eta \cdot \frac{K \cdot T}{q} \cdot \ln\left(\frac{I_3}{I_s}\right) + I_3 \cdot R_p + V_{os} \quad (13)$$

In some examples, temperature module 14 may cause current source 12 to output the second current such that the second current satisfies equation (14), below, where N is the same arbitrary multiplier used by temperature 14 when selecting the second current.

$$I_3 = (2N - 1) \cdot I_1 \quad (14)$$

In some examples, temperature module 14 may determine an intermediate value in accordance with equation (15), below, where $\Delta V_{BE}$ is the intermediate value.

$$\Delta V_{BE} = V_1 - V_2 - (V_3 - V_1) = \eta \cdot \frac{K \cdot T}{q} \cdot \ln\left(\frac{N^2}{2N - 1}\right) \quad (15)$$

By determining the difference between the three voltage values as shown in equation (15), the resulting intermediate value is no longer a function of both the value of series resistance 10 (i.e., $R_p$) and the input offset voltage of the ADC (i.e., $V_{os}$). In other words, the effects of series resistance 10 and the input offset voltage of the ADC are canceled out. When solved for the temperature of p-n junction 6 (i.e., T), equation (15) may be transformed into equation (16), below. Using equation (16), temperature module 14 may determine the temperature of p-n junction 6 based on the intermediate value.

$$T = \frac{\Delta V_{BE}}{\eta \cdot \frac{K}{q} \cdot \ln\left(\frac{N^2}{2N - 1}\right)} \quad (16)$$

In this way, temperature module 14 may determine the temperature of p-n junction 6 such that the determined temperature is not a function of series resistance 10. As such, temperature module 14 may reduce the error introduced by connective elements 8 into the determined temperature.

In some examples, temperature module 14 may reduce the error introduced by connective elements 8 when determining the temperature of p-n junction 6 by determining a value of series resistance 10. For instance, temperature module 14 may determining a plurality of values that each correspond to a respective duty ratio of an ADC, such as an ADC included in device 4, that is measuring a respective voltage drop across p-n junction (i.e., $V_A$) while current source 12 biases p-n junction 6 at a different respective current level. In some examples, each of the plurality of values may be a function of at least: the respective current level, a temperature of the remote p-n junction, and an unknown resistance between the analog-to-digital converter and the remote p-n junction.

For instance, at a first time $T_1$, temperature module 14 may send a signal to current source 12 that causes current source 12 to bias p-n junction 6 with a first current ($I_1$). While p-n junction 6 is biased with the first current, temperature module 14 may determine a first value that corresponds to a duty ratio of the ADC. In some examples, the first value may be representative of equation (17), below, where DR1 is the first value, ɳ is the ideality factor of p-n junction 6, K is the Boltzmann's constant, T is the temperature of p-n junction 6, q is the elementary charge constant, $V_{ref}$ is the reference voltage used by the ADC, N is an arbitrary integer multiplier, $I_{unit}$ is a current level of which current source 12 is capable of generating integer multiples, and $R_p$ is the value of series resistance 10. In some examples, temperature module 14 may cause current source 12 to output $I_1$ such that equation (18) is satisfied for generation different $I_{unit}$ at different time instants $$DR1 = \frac{ɳ \cdot \frac{K \cdot T}{q}}{V_{ref}} \cdot \ln\left(\frac{N \cdot I_{unit}}{I_{unit}}\right) + (N-1) \cdot I_{unit} \cdot R_p \quad (17)$$

$$I_1 = N \cdot I_{unit} \text{ at time instant } T_1; I_1 = I_{unit} \text{ at time instant } T_2 \quad (18)$$

At a first time $T_1$, temperature module 14 may send a signal to current source 12 that causes current source 12 to bias p-n junction 6 with a second current ($I_2$). While p-n junction 6 is biased with the second current, temperature module 14 may determine a second value that corresponds to a duty ratio of the ADC. In some examples, the second value may be representative of equation (19), below, where DR2 is the second value, ɳ is the ideality factor of p-n junction 6, K is the Boltzmann's constant, T is the temperature of p-n junction 6, q is the elementary charge constant, $V_{ref}$ is the reference voltage used by the ADC, N is an arbitrary integer multiplier, $I_{unit}$ is a current level of which current source 12 is capable of generating integer multiples, and $R_p$ is the value of series resistance 10. In some examples, temperature module 14 may cause current source 12 to output $I_2$ such that equation (20) is satisfied for generation different $I_{unit}$ at different time instants, where M is an arbitrary integer multiplier.

$$DR2 = \frac{n \cdot \frac{K \cdot T}{q}}{V_{ref}} \cdot \ln\left(\frac{N \cdot I_{unit}}{I_{unit}}\right) + (N-1) \cdot I_{unit} \cdot R_p \quad (19)$$

$$I_2 = N \cdot I_{unit2} \text{ at time } T_1; I_2 = I_{unit2} \text{ at time } T_2; \quad (20)$$
$$I_{unit2} = M \cdot I_{unit}$$

Temperature module 14 may then determine the value of series resistance 10 based on the difference between the first value and the second value. For instance, temperature module 14 may determine the value of series resistance 10 in accordance with equations (21a) and (21b), below.

$$DR2 - DR1 = (M-1) \cdot (N-1) \cdot I_{unit} \cdot R_p \quad (21a)$$

$$R_p = \frac{DR2 - DR1}{(M-1) \cdot (N-1) \cdot I_{unit}} \quad (21b)$$

Temperature module 14 may then use the determined value of series resistance 10 to determine the temperature of p-n junction 6. For instance, temperature module 14 may determine the temperature of p-n junction 6 in accordance with equation 22.

$$T = \frac{(M-1) \cdot (N-1) \cdot I_{unit} \cdot R_p}{ɳ \cdot \frac{K}{V_{ref} \cdot q} \cdot \ln\left(\frac{N \cdot I_{unit}}{I_{unit}}\right)} \quad (22)$$

In this way, temperature module 14 may determine the temperature of p-n junction 6 such that the determined temperature based on a determined value of series resistance 10. As such, temperature module 14 may reduce the error introduced by connective elements 8 into the determined temperature.

Furthermore, by canceling out or determining series resistance 10, the effects of aging of application board or any effects attributed to conduction imperfections (e.g. chronologic changes of wire resistance, solder aging or chemical changes due to metallic oxidation) can be detected and/or compensated for in accordance with the techniques of this disclosure.

Figure 2:
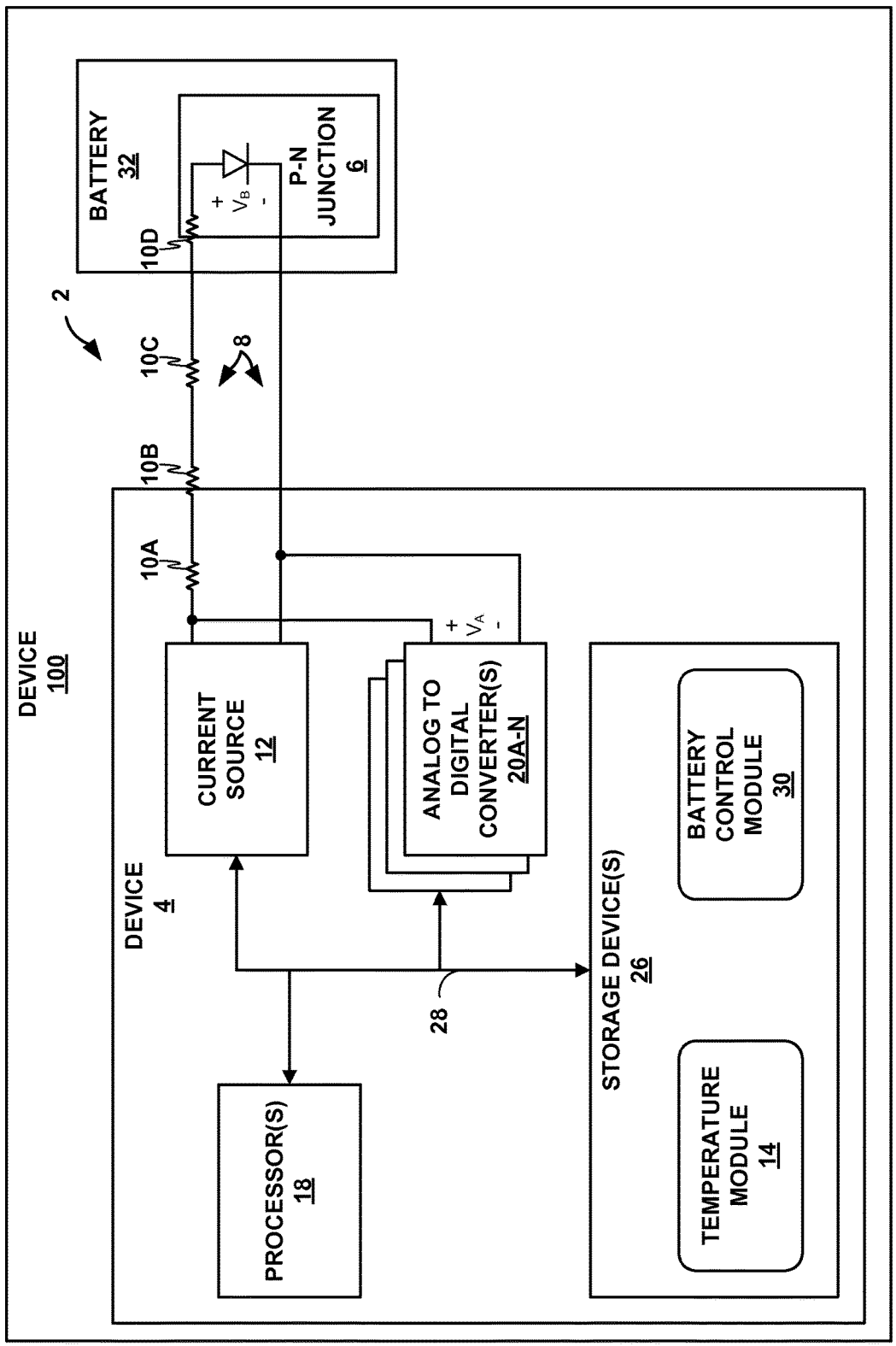
FIG. 2 is a block diagram illustrating details of an example device that may include an example system that includes an example device for determining the temperature of a remote p-n junction, in accordance with one or more techniques of this disclosure.

FIG. 2 is a block diagram illustrating details of an example device 100 that may include example system 2 that includes an example device for determining the temperature of a remote p-n junction, in accordance with one or more techniques of this disclosure. FIG. 2 illustrates one example of device 100, and may other examples of device 100 may be implemented. Examples of device 100 include, but are not limited to, mobile computing devices (e.g., mobile phones, laptop computers, tablet computers, and the like), uninterruptable power supplies (UPSs), vehicles (e.g., hydrocarbon powered vehicles, electric vehicles, hybrid vehicles, and the like), and any other device in which it is desirable to measure a temperature. As illustrated in FIG. 2, device 100 may include battery 32 and system 2, which may include device 4, p-n junction 6, and connective elements 8.

Battery 32 may be configured to provide power to one or more components of device 100. In some examples, battery 32 may be a rechargeable battery. Examples of battery 32 include, but are not limited to, nickel-cadmium, lead-acid, nickel-metal hydride, nickel-zinc, silver-oxide, lithium-ion, or any other type of rechargeable battery. In some examples, during one or both of the charging/discharging process, battery 32 may be exothermic (i.e., increase in temperature). In some examples, the amount of the temperature increase may be related to an amount of current flowing through battery 32.

As described above with reference to FIG. 1, connective elements 8 may electrically couple device 4 to p-n junction 6. Also as described above, in some examples, connective elements 8 may exhibit one or more non-ideal characteristics, such as resistances 10A-10D (collectively, "series resistance 10"). In some examples, such as the example of FIG. 2, series resistance 10 may result from multiple sources within connective elements 8. For instance, series resistance 10 may results from internal wires/connectors of device 4 (e.g., resistance 10A), solder joints where connective elements 8 are coupled to device 4 (e.g., resistance 10B), the wire or routing elements between device 4 and p-n junction 6 (e.g., resistance 10C), and solder joints/connectors and internal wires of p-n junction 6 (e.g., resistance 10D). In some examples, resistances 10A-10D may be considered to be parasitic.

As described above with reference to FIG. 1, p-n junction 6 may be configured to measure a temperature. In some examples, p-n junction 6 may be configured to measure the temperature of a battery, such as battery 32. In some examples, in order to improve the accuracy of the measured temperature, p-n junction 6 may be positioned at the center of battery 32. In some examples, battery 32 and p-n junction 6 may form a single unit that may be removable from device 100.

As illustrated in the example of FIG. 2, device 4 may include current source 12, one or processor(s) 18, one or more analog to digital converters 20A-N, and one or more storage device(s) 26. Each of components 12, 18, 20A-N, and 26 may be interconnected (physically, communicatively, and/or operatively) via communication channels 28 for inter-component communications. In some examples, communication channels 28 may include a system bus, network connection, interprocess communication data structure, or any other channel for communicating data. One or more of storage devices 26, in some examples, may include temperature module 14, and battery control module 30. I/O module 10, reference current module 12, delta current module 14, and control signal module 16 may communicate information with one another as well as with other components in controller 2, such as data 28.

Processors 18, in one example, are configured to implement functionality and/or process instructions for execution within device 4. For example, processors 18 may be capable of processing instructions stored in one or more of storage devices 26. Examples of processors 18 may include any one or more microprocessors, digital signal processors (DSPs), application specific integrated circuits (ASICs), field programmable gate arrays (FPGAs), or any other equivalent integrated or discrete logic circuitry, as well as any combinations of such components.

One or more storage devices 26 may be configured to store information within device 4 during operation. One or more of storage devices 26, in some examples, may comprise a computer-readable storage medium. In some examples, one or more of storage devices 26 may comprise a temporary memory, meaning that a primary purpose of storage devices 26 is not long-term storage. One or more of storage devices 26, in some examples, may comprise a volatile memory, meaning that one or more of storage devices 26 does not maintain stored contents when the system is turned off. Example of volatile memories include random access memories (RAM), dynamic random access memories (DRAM), static random access memories (SRAM), and other forms of volatile memories known in the art. In some examples, one or more of storage devices 26 is used to store program instructions for execution by processors 18. One or more of storage devices 26, in one example, may be used by software or modules running on device 4 (e.g., modules 14, and 30) to temporarily store information during program execution.

One or more of storage devices 26, in some examples, may also include one or more computer-readable storage media. One or more of storage devices 26 may be configured to store larger amounts of information that volatile memory. One or more of storage devices 26 may further be configured for long-term storage of information. In some examples, one or more of storage devices 26 may include non-volatile storage elements. Examples of such non-volatile storage elements include magnetic hard discs, optical discs, floppy discs, flash memories, or forms of electrically programmable memories (EPROM) or electrically erasable and programmable (EEPROM) memories.

Device 4, in some examples, also includes one or more analog to digital converters (ADC) 20A-N (collectively ADC 20). ADC 20 is configured to convert a received analog signal into a digital value. Examples of ADC 20 include a direct conversion ADC, a flash ADC, a successive-approximation ADC, a ramp-compare ADC, a Wilkinson, integrating ADC, a delta-encoded ADC, a pipeline ADC, a sigma-delta ADC, a time-interleaved ADC, or another device capable of converting an analog signal into a digital signal.

As described above with reference to FIG. 1, temperature module 14 may to reduce the effects of an error introduced by connective elements 8 when determining the temperature of p-n junction 6. As one example, temperature module 14 may cancel out series resistance 10 when determining the temperature of p-n junction 6. As another example, temperature module 14 may determine a value of series resistance 10 when determining the temperature of p-n junction 6.

In some examples, device 4 may include battery control module 30 which may be configured to control one or more aspect of battery 32. As one example, battery control module 30 may control an amount of current provided to battery 32 when charging battery 32. As another example, battery control module 30 may control an amount of current drawn from battery 32 when discharging battery 32.

In accordance with one or more techniques of this disclosure, device 4 may reduce the error introduced by connective elements 8 when determining the temperature of p-n junction 6. As discussed above, temperature module 14 of device 4 may reduce the error introduced by connective elements 8 when determining the temperature of p-n junction 6 by canceling out the effects of the error introduced by connective elements 8. In some examples, temperature module 14 may cancel out the error introduced by connective elements 8 when determining the temperature of p-n junction 6 by determining a difference between a plurality of voltage values that each correspond to a respective voltage drop across p-n junction 6 while current source 12 biases p-n junction 6 at a different respective current level. For instance, temperature module 14 may cancel out series resistance 10 introduced by connective elements 8 in accordance with equations (2a)-(7) and/or equations (8)-(16), above.

As discussed above, temperature module 14 may reduce the error introduced by connective elements 8 when determining the temperature of p-n junction 6 by determining a value of series resistance 10. For instance, temperature module 14 may determining a plurality of values that each correspond to a respective duty ratio of an ADC of ADCs 20, that is measuring a respective voltage drop across p-n junction (i.e., $V_A$) while current source 12 biases p-n junction 6 at a different respective current level. In some examples, each of the plurality of values may be a function of at least: the respective current level, a temperature of the remote p-n junction, and an unknown resistance between the analog-to-digital converter and the remote p-n junction. In some examples, temperature module 14 may determine a value of series resistance 10 in accordance with equations (17)-(21b), above. Using the determined value of series resistance 10, temperature module 14 may determine the temperature of p-n junction 6 in accordance with equation (22), above. In some examples, temperature module 14 may output the determined temperature of p-n junction to battery control module 30.

Battery control module 30 may receive the determined temperature from temperature module 14 and determine whether or not it satisfies one or more thresholds. For instance, where battery 32 is being charged, battery control module 30 may determine that the temperature satisfies a threshold where the determined temperature is less than a maximum charging temperature of battery 32. In some examples, responsive to determining that the determined temperature does not satisfy one or more thresholds, battery control module 30 may adjust an amount of current being supplied to (or drawn from) battery 32.

Figure 3:
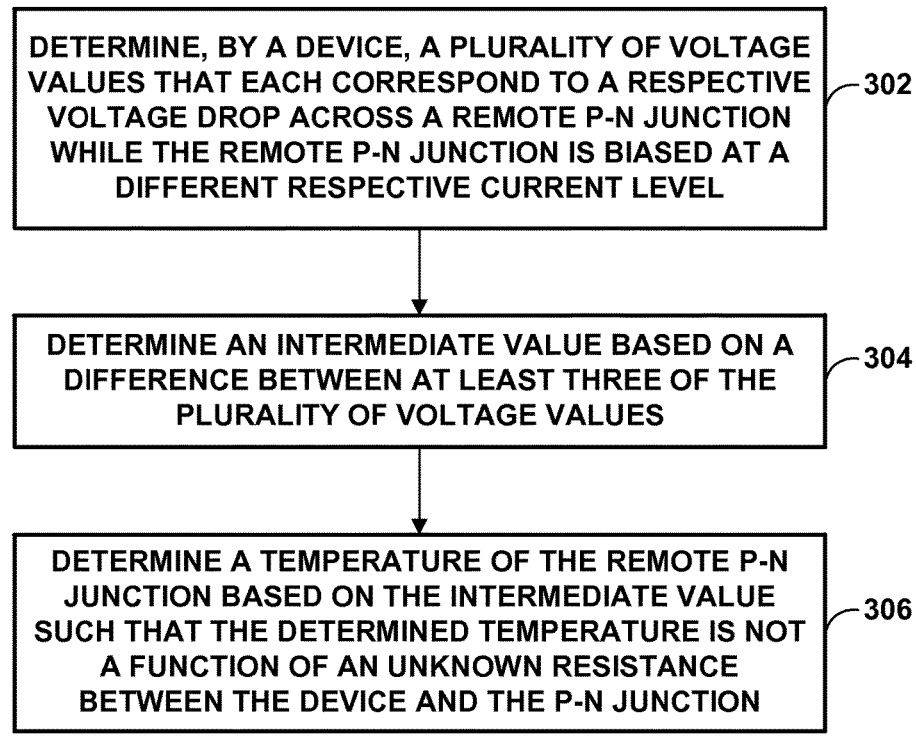
FIG. 3 is a flowchart illustrating example operations of a device configured to determine the temperature of a remote p-n junction, in accordance with one or more techniques of this disclosure.

FIG. 3 is a flowchart illustrating example operations of a device configured to determine the temperature of a remote p-n junction, in accordance with one or more techniques of this disclosure. For purposes of illustration only, the example operations are described below within the context of device 4, as shown in FIGS. 1-2.

In the example of FIG. 3, device 4 may determine a plurality of voltage values that each correspond to a respective voltage drop across a remote p-n junction while the remote p-n junction is biased at a different respective current level (302). As discussed above, each of the plurality of voltage values may be a function of at least: the respective current level, a temperature of the remote p-n junction, and an unknown resistance between the device and the remote p-n junction. As discussed above, current source 12 of device 4 may output the current that biases the remote p-n junction at the different respective current levels. In some examples, the different respective current levels may satisfy one or more conditions with respect to each other. For instance, the difference respective current levels may satisfy one or more of above equations (4), (9), (12), and (14).

Device 4 may then determine an intermediate value based on a difference between at least three of the plurality of voltage values (304). As discussed above, device 4 may determine the intermediate value as a difference between two delta voltage values that are each determined based on a difference between a respective pair of the determined voltage values. In some examples, device 4 may determine the intermediate value in accordance with one or more of above equations (6a)-(6c), and (15).

Device 4 may then determine the temperature of the remote p-n junction based on the intermediate value such that the determined temperature is not a function of the unknown resistance between device 4 and the p-n junction (306). In some examples, device 4 may determine the temperature of the remote p-n junction in accordance with one or more of above equations (7), and (16).

Figure 4:
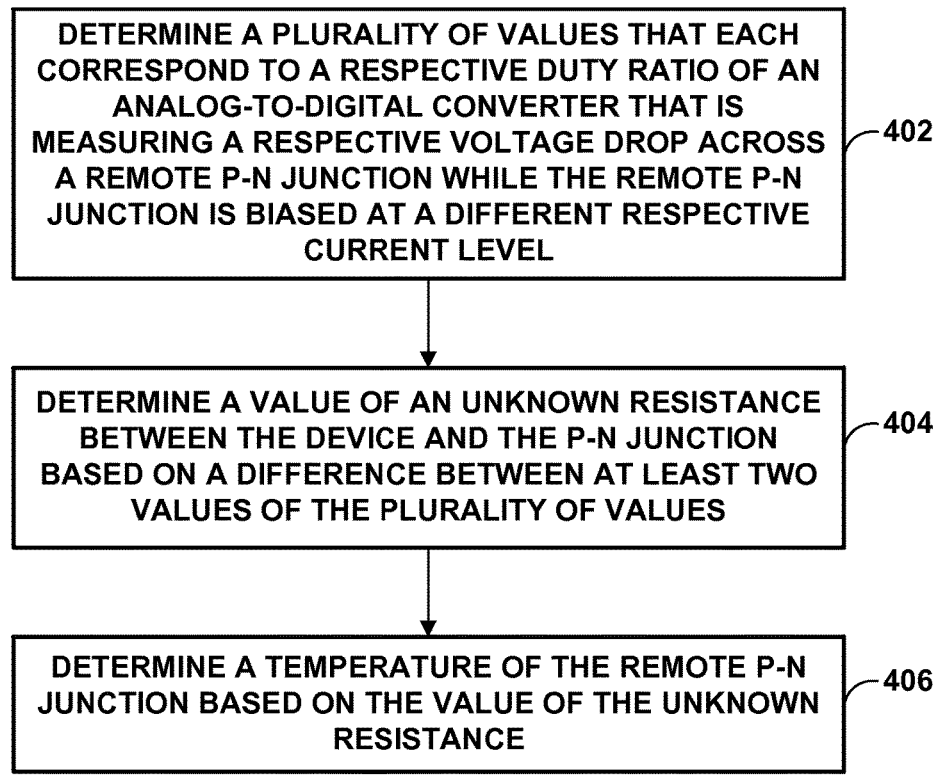
FIG. 4 is a flowchart illustrating example operations of a device configured to determine the temperature of a remote p-n junction, in accordance with one or more techniques of this disclosure.

FIG. 4 is a flowchart illustrating example operations of a device configured to determine the temperature of a remote p-n junction, in accordance with one or more techniques of this disclosure. For purposes of illustration only, the example operations are described below within the context of device 4, as shown in FIGS. 1-2.

In the example of FIG. 4, device 4 may determine a plurality of values that each correspond to a respective duty ratio of an analog-to-digital converter that is measuring a respective voltage drop across a remote p-n junction while the remote p-n junction is biased at a different respective current level (402). As discussed above, each of the plurality of voltage values may be a function of at least: the respective current level, a temperature of the remote p-n junction, and an unknown resistance between the device and the remote p-n junction. In some examples, device 4 may determine the plurality of values in accordance with one or more of above equations (17)-(20).

Device 4 may then determine a value of the unknown resistance based on a difference between at least two values of the plurality of values (404). In some examples, device 4 may determine the value of the unknown resistance in accordance with one or more of above equations (21a)-(21b).

Device 4 may then determine the temperature of the remote p-n junction based on the determined value of the unknown resistance (406). In some examples, device 4 may determine the temperature in accordance with above equation (22).

Figure 5:
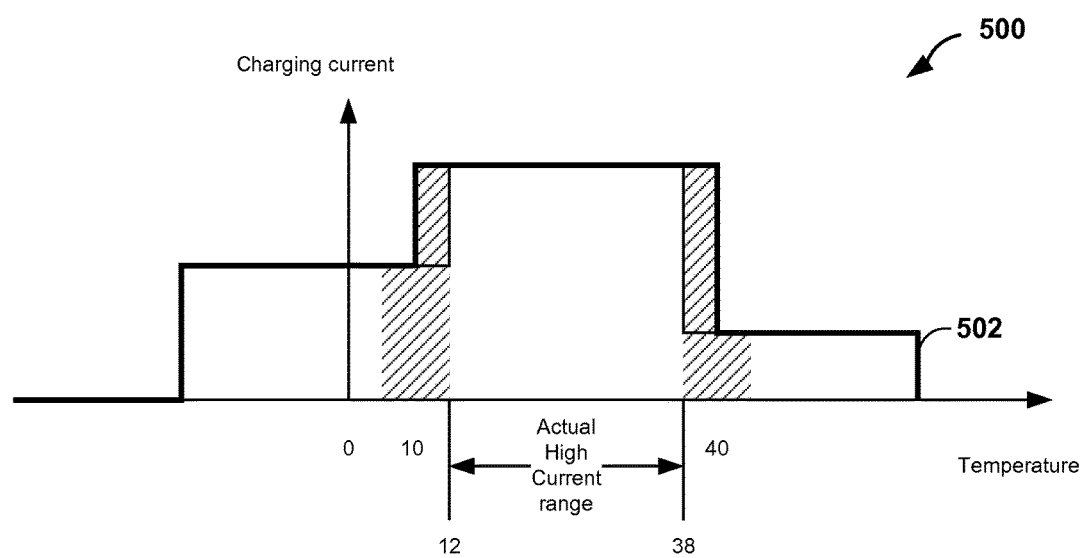
FIG. 5 is a graph illustrating an example relationship between charging current and temperature of a battery, in accordance with one or more techniques of this disclosure.

FIG. 5 is a graph illustrating an example relationship between charging current and temperature of a battery, in accordance with one or more techniques of this disclosure. As illustrated by FIG. 5, graph 500 includes a horizontal axis that indicates a temperature of an example battery a vertical axis that indicates a charging current of the battery, and plot 502 that indicates a maximum allowable charging current of the battery. In some examples, an error may be introduced when measuring the temperature of the battery. For instance, the temperature of the battery may be determined with +/−2 degrees Celsius accuracy. As such, if the determined temperature of the battery is 40 degrees Celsius, the actual temperature of the battery may be between 38 and 42 degrees Celsius. As illustrated by plot 502, the maximum charging current of the battery may vary based on the determined temperature. In some examples, in order to comply with the temperature based maximum charging current, the battery may only be charged based on the "worst case" temperature. For instance, if the determined temperature of the battery is 40 degrees Celsius with +/−2 degrees Celsius accuracy, the maximum charging current for the battery may be determined as if the temperature of the battery is 38 degrees Celsius.

As discussed above, a device (e.g., device 4 of FIGS. 1-2) may utilize a p-n junction to measure a temperature. For instance, device 4 may utilize remote p-n junction 6 to measure the temperature of a battery (e.g., battery 32 of FIG. 2). In accordance with one or more techniques of this disclosure, the device may reduce the error introduced when measuring the temperature of the battery. In this way, the device may improve the accuracy of the measured temperature of the battery such that the "worst case" temperature is not as low, which may allow charging of the battery at an increased current level. In this way, the device may reduce the amount of time needed to charge the battery.

Figure 6:
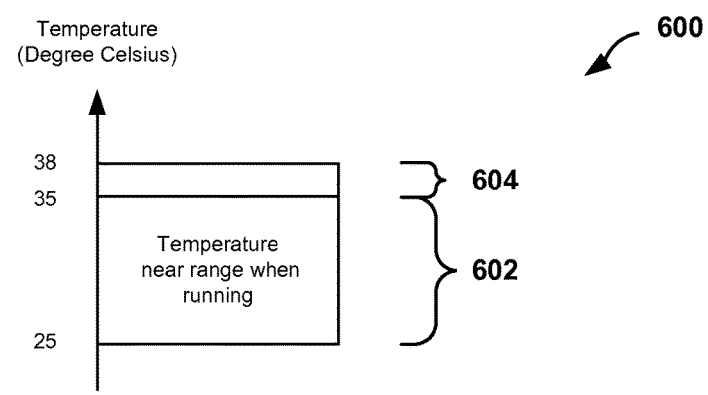
FIG. 6 is a graph illustrating example temperature levels of a battery, in accordance with one or more techniques of this disclosure.

FIG. 6 is a graph illustrating example temperature levels of a battery, in accordance with one or more techniques of this disclosure. As illustrated by FIG. 6, graph 600 includes a vertical axis that indicates a temperature of a battery. As shown by graph 600, when a device (e.g., device 100 of FIG. 2) is running/operating (e.g., drawing current from the battery), the determined temperature of the battery may be within range 602 (e.g., from approximately room temperature/25 degrees Celsius to approximately 35 degrees Celsius). However, in some examples, when the battery is charging, the temperature of the battery may rise above range 602 and enter range 604 (e.g., from approximately 35 degrees Celsius to 38 degrees Celsius).

Figure 7:
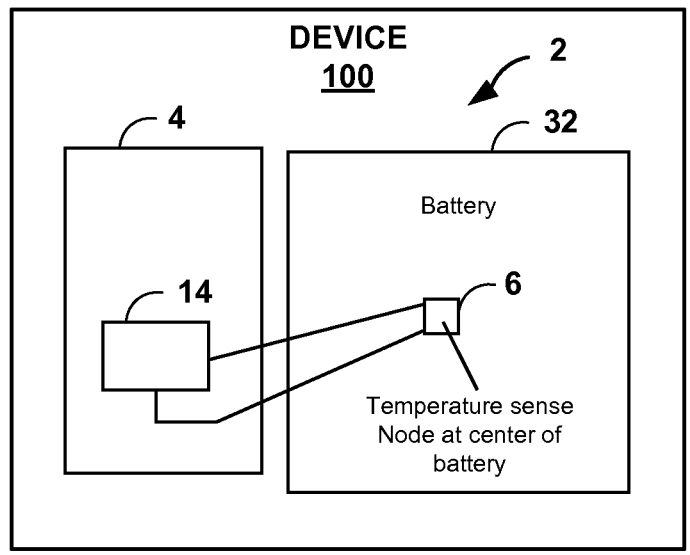
FIG. 7 is a conceptual diagram illustrating an example system that includes a device for determining the temperature of a remote p-n junction that is physically located near a battery, in accordance with one or more techniques of this disclosure.

FIG. 7 is a conceptual diagram illustrating an example system that includes a device for determining the temperature of a remote p-n junction that is physically located near a battery, in accordance with one or more techniques of this disclosure. As illustrated in FIG. 7, device 100 may include system 2 and battery 32. As discussed above, in some examples, system 2 may include device 4 (which may include temperature module 14), and p-n junction 6. As illustrated in FIG. 7, in some examples, p-n junction 6 may be positioned at a center of battery 32. In this way, the temperature of p-n junction 6, and by association the temperature determined by temperature module 14, may more accurately reflect the temperature of battery 32.

Example 1

A method comprising: determining, by a device, a plurality of voltage values that each correspond to a respective voltage drop across a remote p-n junction while the remote p-n junction is biased at different respective current levels, wherein each of the plurality of voltage values is a function of at least: one of the different respective current levels, a temperature of the remote p-n junction, and a series resistance between the device and the remote p-n junction; determining, by the device, an intermediate value based on a difference between at least three voltage values of the plurality of voltage values, wherein the intermediate value is not a function of the series resistance; and determining, by the device, the temperature of the remote p-n junction based on the intermediate value such that the temperature is not a function of the series resistance.

Example 2

The method of example 1, wherein determining the intermediate value comprises: determining a first delta voltage value as a difference between a first pair of voltage values of the at least three voltage values; determining a second delta voltage value as a difference between a second pair of voltage values of the at least three voltage values; and determining the intermediate value as a difference between the second delta voltage value and the first delta voltage value, wherein the intermediate value is not a function of the series resistance.

Example 3

The method of any combination of examples 1-2, wherein a difference between the respective current levels at which the remote p-n junction was biased while the respective voltage values of the first pair of voltage values were determined is the same as a difference between the respective current levels at which the remote p-n junction was biased while the respective voltage values of the second pair of voltage values were determined.

Example 4

The method of any combination of examples 1-3, wherein a particular voltage value of the first pair of respective voltage values is included in the second pair of respective voltage values.

Example 5

The method of any combination of examples 1-4, wherein the voltage value included in the first pair of voltage values are not the same as the voltage values included in the second pair of voltage values such that the intermediate value is determined based on at least four voltage values of the plurality of voltage values.

Example 6

The method of any combination of examples 1-5, wherein the temperature is determined approximately according to the following equation:

$$T = \frac{(V_{be1} - V_{be2}) - (V_{be3} - V_{be4})}{\eta \cdot \frac{K}{q} \cdot \ln\left(\frac{I_{D1} \cdot I_{D4}}{I_{D2} \cdot I_{D3}}\right)}$$

wherein $V_{be1}$ is a first voltage value of the at least three voltage values, $V_{be2}$ is a second voltage value of the at least three voltage values, $V_{be3}$ is a third voltage value of the at least three voltage values, $V_{be4}$ is a fourth voltage value of the at least three voltage values, $\eta$ is a property of the remote p-n junction, K is the Boltzmann's constant, T is the temperature of the remote p-n junction, q is the elementary charge constant, $I_{D1}$ is the current level at which the remote p-n junction was biased while the first voltage value was determined, $I_{D2}$ is the current level at which the remote p-n junction was biased while the second voltage value was determined, $I_{D3}$ is the current level at which the remote p-n junction was biased while the third voltage value was determined, and $I_{D4}$ is the current level at which the remote p-n junction was biased while the fourth voltage value was determined.

Example 7

The method of any combination of examples 1-6, wherein the temperature is determined approximately according to the following equation:

$$T = \frac{V_{be1} - V_{be2} - (V_{be3} - V_{be1})}{\eta \cdot \frac{K}{q} \cdot \ln\left(\frac{N^2}{2N-1}\right)}$$

wherein $V_{be1}$ is a first voltage value of the at least three voltage values, $V_{be2}$ is a second voltage value of the at least three voltage values, $V_{be3}$ is a third voltage value of the at least three voltage values, $\eta$ is a property of the remote p-n junction, K is the Boltzmann's constant, T is the temperature of the remote p-n junction, q is the elementary charge constant, and N is a scaling factor that indicates a relationship between the respective current levels at which the remote p-n junction was biased while the at least three voltage values were determined.

Example 8

The method of any combination of examples 1-7, wherein the p-n junction is configured to measure a temperature of a battery, the method further comprising: adjusting a charging current of the battery based on the determined temperature of the p-n junction.

Example 9

A device comprising: an analog-to-digital converter configured to determine a plurality of voltage values that each correspond to a respective voltage drop across a remote p-n junction while the remote p-n junction is biased at different respective current levels, wherein each of the plurality of voltage values is a function of at least: one of the different respective current levels, a temperature of the remote p-n junction, and a series resistance between the device and the remote p-n junction; and one or more processors configured to determine an intermediate value based on a difference between at least three voltage values of the plurality of voltage values, wherein the intermediate value is not a function of the series resistance, wherein the one or more processors are further configured to determine, by the device, the temperature of the remote p-n junction based on the intermediate value such that the temperature is not a function of the series resistance.

Example 10

The device of example 9, wherein the one or more processors are configured to determine the intermediate value by at least: determining a first delta voltage value as a difference between a first pair of voltage values of the at least three voltage values; determining a second delta voltage value as a difference between a second pair of voltage values of the at least three voltage values; and determining the intermediate value as a difference between the second delta voltage value and the first delta voltage value, wherein the intermediate value is not a function of the series resistance.

Example 11

The device of any combination of examples 9-10, wherein a difference between the respective current levels at which the remote p-n junction was biased while the respective voltage values of the first pair of voltage values were determined is the same as a difference between the respective current levels at which the remote p-n junction was biased while the respective voltage values of the second pair of voltage values were determined.

Example 12

The device of any combination of examples 9-11, wherein a particular voltage value of the first pair of respective voltage values is included in the second pair of respective voltage values.

Example 13

The device of any combination of examples 9-12, wherein the voltage value included in the first pair of voltage values are not the same as the voltage values included in the second pair of voltage values such that the intermediate value is determined based on at least four voltage values of the plurality of voltage values.

Example 14

A device comprising: means for determining a plurality of voltage values that each correspond to a respective voltage drop across a remote p-n junction while the remote p-n junction is biased at different respective current levels, wherein each of the plurality of voltage values is a function of at least: one of the respective current levels, a temperature of the remote p-n junction, and a series resistance between the device and the remote p-n junction; means for determining an intermediate value based on a difference between at least three voltage values of the plurality of voltage values, wherein the intermediate value is not a function of the series resistance; and means for determining the temperature of the remote p-n junction based on the intermediate value such that the temperature is not a function of the series resistance.

Example 15

The device of example 14, wherein determining the intermediate value comprises: determining a first delta voltage value as a difference between a first pair of voltage values of the at least three voltage values; determining a second delta voltage value as a difference between a second pair of voltage values of the at least three voltage values; and determining the intermediate value as a difference between the second delta voltage value and the first delta voltage value, wherein the intermediate value is not a function of the series resistance.

Example 16

The device of any combination of examples 14-15, wherein a difference between the respective current levels at which the remote p-n junction was biased while the respective voltage values of the first pair of voltage values were determined is the same as a difference between the respective current levels at which the remote p-n junction was biased while the respective voltage values of the second pair of voltage values were determined.

Example 17

The device of any combination of examples 14-16, wherein a particular voltage value of the first pair of respective voltage values is included in the second pair of respective voltage values.

Example 18

The device of example 14, further comprising means for performing any combination of the method of examples 1-8.

Example 19

A computer-readable storage medium storing instructions that, when executed, cause one or more processors of a device to perform any combination of the method of examples 1-8.

Example 20

A method comprising: determining, by a device, a plurality of values that each correspond to a respective duty ratio of an analog-to-digital converter (ADC) that is measuring a respective voltage drop across a remote p-n junction while the remote p-n junction is biased at different respective current levels, wherein each of the plurality of values is a function of at least: one of the different respective current levels, a temperature of the remote p-n junction, and a series resistance between the analog-to-digital converter and the remote p-n junction; determining, by the device, the series resistance between the ADC and the remote p-n junction based on a difference between at least two values of the plurality of values; and determining, by the device, the temperature of the remote p-n junction as a function of the determined series resistance.

Example 21

The method of example 20, wherein the ADC is a sigma-delta ADC, wherein the temperature is determined approximately according to the following equation:

$$T = \frac{(M-1)\cdot(N-1)\cdot I_{unit}\cdot R_p}{\eta \cdot \frac{K}{V_{ref}\cdot q}\cdot \ln\left(\frac{N\cdot I_{unit}}{I_{unit}}\right)}$$

wherein M is a first arbitrary integer multiplier, N is a second arbitrary integer multiplier, $I_{unit}$ is a current level of which current source is capable of generating integer multiples, and $R_p$ is the value of the series resistance, η is a property of the remote p-n junction, K is the Boltzmann's constant, T is the temperature of the remote p-n junction, q is the elementary charge constant, and $V_{ref}$ is the reference voltage used by the ADC.

Example 22

A device comprising: an analog-to-digital converter (ADC) configured to determine a plurality of values that each correspond to a respective duty ratio of the ADC while the ADC is measuring a respective voltage drop across a remote p-n junction while the remote p-n junction is biased at different respective current levels, wherein each of the plurality of values is a function of at least: one of the different respective current levels, a temperature of the remote p-n junction, and a series resistance between the analog-to-digital converter and the remote p-n junction; and one or more processors configured to determine the unknown resistance between the ADC and the remote p-n junction based on a difference between at least two values of the plurality of values, wherein the one or more processors are further configured to determine the temperature of the remote p-n junction as a function of the determined series resistance.

Example 23

The device of example 22, wherein the ADC is a sigma-delta ADC, wherein the one or more processors are configured to determine the temperature approximately according to the following equation:

$$T = \frac{(M-1)\cdot(N-1)\cdot I_{unit}\cdot R_p}{\eta \cdot \frac{K}{V_{ref}\cdot q}\cdot \ln\left(\frac{N\cdot I_{unit}}{I_{unit}}\right)}$$

wherein M is a first arbitrary integer multiplier, N is a second arbitrary integer multiplier, $I_{unit}$ is a current level of which current source is capable of generating integer multiples, and $R_p$ is the value of the series resistance, η is a property of the remote p-n junction, K is the Boltzmann's constant, T is the temperature of the remote p-n junction, q is the elementary charge constant, and $V_{ref}$ is the reference voltage used by the ADC.

Example 24

A device comprising means for performing any combination of the method of examples 20-21.

Example 25

A computer-readable storage medium storing instructions that, when executed, cause one or more processors of a device to perform any combination of the method of examples 20-21.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various aspects have been described in this disclosure. These and other aspects are within the scope of the following claims.

The invention claimed is:

1. A method comprising:
   determining, by a device, a plurality of voltage values that each correspond to a respective voltage drop across a remote p-n junction while the remote p-n junction is biased at different respective current levels, wherein each of the plurality of voltage values is a function of at least: one of the different respective current levels, a temperature of the remote p-n junction, and a series resistance between the device and the remote p-n junction;

determining, by the device, an intermediate value based on a difference between at least three voltage values of the plurality of voltage values, wherein the intermediate value is not a function of the series resistance; and determining, by the device, the temperature of the remote p-n junction based on the intermediate value such that the temperature is not a function of the series resistance.

2. The method of claim 1, wherein the temperature is determined approximately according to the following equation:

$$T = \frac{(V_{be1} - V_{be2}) - (V_{be3} - V_{be4})}{\eta \cdot \frac{K}{q} \cdot \ln\left(\frac{I_{D1} \cdot I_{D4}}{I_{D2} \cdot I_{D3}}\right)}$$

wherein $V_{be1}$ is a first voltage value of the at least three voltage values, $V_{be2}$ is a second voltage value of the at least three voltage values, $V_{be3}$ is a third voltage value of the at least three voltage values, $V_{be4}$ is a fourth voltage value of the at least three voltage values, $\eta$ is a property of the remote p-n junction, K is the Boltzmann's constant, T is the temperature of the remote p-n junction, q is the elementary charge constant, $I_{D1}$ is the current level at which the remote p-n junction was biased while the first voltage value was determined, $I_{D2}$ is the current level at which the remote p-n junction was biased while the second voltage value was determined, $I_{D3}$ is the current level at which the remote p-n junction was biased while the third voltage value was determined, and $I_{D4}$ is the current level at which the remote p-n junction was biased while the fourth voltage value was determined.

3. The method of claim 1, wherein the temperature is determined approximately according to the following equation:

$$T = \frac{V_{be1} - V_{be2} - (V_{be3} - V_{be1})}{\eta \cdot \frac{K}{q} \cdot \ln\left(\frac{N^2}{2N-1}\right)}$$

wherein $V_{be1}$ is a first voltage value of the at least three voltage values, $V_{be2}$ is a second voltage value of the at least three voltage values, $V_{be3}$ is a third voltage value of the at least three voltage values, $\eta$ is a property of the remote p-n junction, K is the Boltzmann's constant, T is the temperature of the remote p-n junction, q is the elementary charge constant, and N is a scaling factor that indicates a relationship between the respective current levels at which the remote p-n junction was biased while the at least three voltage values were determined.

4. The method of claim 1, wherein the p-n junction is configured to measure a temperature of a battery, the method further comprising:
adjusting a charging current of the battery based on the determined temperature of the p-n junction.

5. The method of claim 1, wherein determining the intermediate value comprises:
determining a first delta voltage value as a difference between a first pair of voltage values of the at least three voltage values;

determining a second delta voltage value as a difference between a second pair of voltage values of the at least three voltage values; and determining the intermediate value as a difference between the second delta voltage value and the first delta voltage value, wherein the intermediate value is not a function of the series resistance.

6. The method of claim 5, wherein a difference between the respective current levels at which the remote p-n junction was biased while the respective voltage values of the first pair of voltage values were determined is the same as a difference between the respective current levels at which the remote p-n junction was biased while the respective voltage values of the second pair of voltage values were determined.

7. The method of claim 5, wherein a particular voltage value of the first pair of respective voltage values is included in the second pair of respective voltage values.

8. The method of claim 5, wherein the voltage value included in the first pair of voltage values are not the same as the voltage values included in the second pair of voltage values such that the intermediate value is determined based on at least four voltage values of the plurality of voltage values.

9. A device comprising:
an analog-to-digital converter configured to determine a plurality of voltage values that each correspond to a respective voltage drop across a remote p-n junction while the remote p-n junction is biased at different respective current levels, wherein each of the plurality of voltage values is a function of at least: one of the different respective current levels, a temperature of the remote p-n junction, and a series resistance between the device and the remote p-n junction; and one or more processors configured to determine an intermediate value based on a difference between at least three voltage values of the plurality of voltage values, wherein the intermediate value is not a function of the series resistance, wherein the one or more processors are further configured to determine, by the device, the temperature of the remote p-n junction based on the intermediate value such that the temperature is not a function of the series resistance.

10. The device of claim 9, wherein the one or more processors are configured to determine the intermediate value by at least:
determining a first delta voltage value as a difference between a first pair of voltage values of the at least three voltage values;

determining a second delta voltage value as a difference between a second pair of voltage values of the at least three voltage values; and determining the intermediate value as a difference between the second delta voltage value and the first delta voltage value, wherein the intermediate value is not a function of the series resistance.

11. The device of claim 10, wherein a difference between the respective current levels at which the remote p-n junction was biased while the respective voltage values of the first pair of voltage values were determined is the same as a difference between the respective current levels at which the remote p-n junction was biased while the respective voltage values of the second pair of voltage values were determined.

12. The device of claim 10, wherein a particular voltage value of the first pair of respective voltage values is included in the second pair of respective voltage values.

13. The device of claim 10, wherein the voltage value included in the first pair of voltage values are not the same as the voltage values included in the second pair of voltage values such that the intermediate value is determined based on at least four voltage values of the plurality of voltage values.

14. A device comprising:

means for determining a plurality of voltage values that each correspond to a respective voltage drop across a remote p-n junction while the remote p-n junction is biased at different respective current levels, wherein each of the plurality of voltage values is a function of at least: one of the respective current levels, a temperature of the remote p-n junction, and a series resistance between the device and the remote p-n junction;

means for determining an intermediate value based on a difference between at least three voltage values of the plurality of voltage values, wherein the intermediate value is not a function of the series resistance; and means for determining the temperature of the remote p-n junction based on the intermediate value such that the temperature is not a function of the series resistance.

15. The device of claim 14, wherein determining the intermediate value comprises:

determining a first delta voltage value as a difference between a first pair of voltage values of the at least three voltage values;

determining a second delta voltage value as a difference between a second pair of voltage values of the at least three voltage values; and determining the intermediate value as a difference between the second delta voltage value and the first delta voltage value, wherein the intermediate value is not a function of the series resistance.

16. The device of claim 15, wherein a difference between the respective current levels at which the remote p-n junction was biased while the respective voltage values of the first pair of voltage values were determined is the same as a difference between the respective current levels at which the remote p-n junction was biased while the respective voltage values of the second pair of voltage values were determined.

17. The device of claim 15, wherein a particular voltage value of the first pair of respective voltage values is included in the second pair of respective voltage values.

18. The device of claim 15, wherein the voltage value included in the first pair of voltage values are not the same as the voltage values included in the second pair of voltage values such that the intermediate value is determined based on at least four voltage values of the plurality of voltage values.

* * * * *